United States Patent
Taniguchi

(10) Patent No.: US 6,292,071 B1
(45) Date of Patent: Sep. 18, 2001

(54) SURFACE ACOUSTIC WAVE FILTER FOR IMPROVING FLATNESS OF A PASS BAND AND A METHOD OF MANUFACTURING THEREOF

(75) Inventor: Norio Taniguchi, Ishikawa-gun (JP)

(73) Assignee: Murata Manufacturing, Co., Ltd., Kyoto (JP)

( * ) Notice: Subject to any disclaimer, the term of this patent is extended or adjusted under 35 U.S.C. 154(b) by 0 days.

(21) Appl. No.: 09/435,752

(22) Filed: Nov. 8, 1999

(30) Foreign Application Priority Data

Nov. 25, 1998 (JP) .................................. 10-334267

(51) Int. Cl.⁷ ............................. H03H 9/64; H03H 9/72
(52) U.S. Cl. ...................... 333/133; 333/193; 333/194; 333/195; 310/313 B
(58) Field of Search .................................. 333/193–196, 333/133; 310/313 R, 313 B, 313 C, 313 D

(56) References Cited

U.S. PATENT DOCUMENTS

| 5,729,186 | * | 3/1998 | Seki et al. | 333/194 |
| 6,172,580 | * | 1/2001 | Taniguchi et al. | 333/193 |
| 6,208,223 | * | 3/2001 | Shimamura et al. | 333/193 |

FOREIGN PATENT DOCUMENTS

| 199 23 962 | 12/1999 | (DE) . |
| 0 788 224 | 8/1997 | (EP) . |
| 56-19765 | 5/1981 | (JP) . |
| 6-232682 | 8/1994 | (JP) . |
| 10-242799 | * 9/1998 | (JP) . |
| 11-251871 | * 9/1999 | (JP) . |
| WO 98/19394 | 5/1998 | (WO) . |

OTHER PUBLICATIONS

Japanese Patent Abstract 60–185416; Dated: Sep. 1985; Author: .Yamada Yun; Title: Surface Acoustic Wave Element.

* cited by examiner

Primary Examiner—Robert Pascal
Assistant Examiner—Barbara Summons
(74) Attorney, Agent, or Firm—Keating & Bennett, LLP

(57) ABSTRACT

A surface acoustic wave filter has a plurality of interdigital transducers arranged in a ladder circuit structure and includes a series arm and at least two parallel arms. Each of the interdigital transducers has a first comb-shaped electrode and a second comb-shaped electrode, each of which has a plurality of electrode fingers and a bus bar connected to first ends of the plurality of electrode fingers. The first and second comb-shaped electrodes interdigitate with each other so that second ends of the plurality of electrode fingers of the first comb-shaped electrode extend toward the bus bar of the second comb-shaped electrode. A gap is created in the interdigital transducers defining the surface acoustic wave resonators that are connected to the parallel arms to cause ripples to be distributed in the pass band of the surface acoustic wave filter such that the ripples improve the flatness of the pass band. The gap is defined between the bus bar of the first comb-shaped electrode and the second ends of the plurality of electrode fingers of the second comb-shaped electrode. The gap width should be greater than about 0.50 $\lambda$, and preferably should be in the range of about 1.0 $\lambda$ to about 5.0 $\lambda$, wherein $\lambda$ is a wavelength of a surface acoustic wave excited on the piezoelectric substrate. Further, the gap in the interdigital transducer of the one-port SAW resonator that is connected at one parallel arm is different from the corresponding gap in the interdigital transducer of the one-port SAW resonator connected at the other parallel arm.

22 Claims, 13 Drawing Sheets

US 6,292,071 B1

SURFACE ACOUSTIC WAVE FILTER FOR IMPROVING FLATNESS OF A PASS BAND AND A METHOD OF MANUFACTURING THEREOF

BACKGROUND OF THE INVENTION

1. Field of the Invention

The present invention relates to a surface acoustic wave filter which defines, for example, a band pass filter. More specifically, the present invention relates to a structure of a surface acoustic wave filter (SAW filter), in which a plurality of one-port surface acoustic wave resonators (SAW resonators) are connected so as to define a ladder circuit, and a method of manufacturing thereof.

2. Description of the Related Art

Conventionally, a SAW filter has been widely used as a band pass filter. For example, in Japanese Examined Patent Publication No. 56-19765, there is provided a SAW filter having an arrangement such that a plurality of one-port SAW resonators constitute a ladder circuit.

Referring to FIGS. 13 and 14, a description of the above-mentioned SAW filter having a ladder circuit structure will be provided. In the SAW filter of FIGS. 13 and 14, a series arm for connecting an input end and an output end, and a parallel arm for connecting the series arm and a reference potential are provided. A one-port SAW resonator S1 defining a series-arm resonator is connected to the series arm, and a one-port SAW resonator P1 defining a parallel-arm resonator is connected to the parallel arm. In FIG. 13, only one series-arm resonator and one parallel-arm resonator are shown. However, the number of series-arm resonators and parallel-arm resonators included in the filter is determined by the desired filter characteristics.

Referring to FIG. 14, the conventional one-port SAW resonator has an electrode structure such that an interdigital transducer (IDT) 51 has a reflector 52 on a first side thereof and a reflector 53 on a second side thereof, all arranged on a piezoelectric substrate (not shown).

The IDT 51 has a pair of bus bars 54 and 55 which extend along a direction in which a surface acoustic wave propagates. The bus bar 54 is connected to one end of each of a plurality of electrode fingers 56. The electrode fingers 56 extend in a direction that is perpendicular to the direction in which a surface acoustic wave propagates, in other words, in a direction towards the bus bar 55 on the opposite side of the bus bar 54. Similarly, the bus bar 55 is connected to one end of each of a plurality of electrode fingers 57. The plurality of electrode fingers 57 extend towards the bus bar 54. The electrode fingers 56 and 57 are arranged to be interdigitated with each other.

A plurality of the above one-port SAW resonators are arranged to constitute the ladder circuit as shown in FIG. 13, so as to define a SAW filter. FIG. 15 shows the attenuation-frequency characteristics of the SAW filter.

Since the SAW filter having the ladder circuit structure provides small insertion loss and has a wide pass band, SAW filters have been widely used as band pass filters in cellular phones or other similar devices.

Note that in Japanese Unexamined Patent Publication No. 6-232682, there is provided a one-port SAW resonator where a LiTaO$_3$ substrate is used as a piezoelectric substrate. In this Japanese Unexamined Patent Publication, it is disclosed that if the ratio between the electrode finger cross length (aperture) of an IDT and the gap width between one bus bar and the top end of the electrode finger connected to the other bus bar is set at greater values, the effect of a ripple that occurs between the resonant frequency and the anti-resonant frequency can be suppressed.

Although the conventional SAW filter having a ladder circuit structure with a plurality of one-port SAW resonators (as disclosed in Japanese Examined Patent Publication No. 56-19765) has small insertion loss and a wide pass band, the flatness of the filter characteristics within the pass band is inadequate. More specifically, the insertion loss is less at the center of the pass band than at the shoulder ends of the pass band.

Further, in the above-mentioned SAW filter, due to the LiTaO$_3$ substrate, the ripple that occurs between the resonant frequency and the anti-resonant frequency causes undesirable filter characteristics. Referring to FIG. 16, the graph shows the impedance-frequency characteristics of a conventional one-port SAW resonator when arranged on the LiTaO$_3$ substrate. As indicated by the arrow A, the ripple occurs between the resonant frequency and the anti-resonant frequency. Further, because the conventional SAW filter combines a plurality of one-port SAW resonators to provide filter characteristics, when the ripple occurs in the one-port SAW resonators, a ripple also occurs in the filter characteristics of the SAW filter, which corresponds to the frequency of the ripples in the one-port SAW resonators. Thus, referring to FIG. 17, which shows the attenuation-frequency characteristics of the above-mentioned SAW filter, the ripple appears on the low frequency shoulder of the pass band of the SAW filter, as indicated by the arrow B. The appearance of the ripple is significant because the effect of the ripple increases the insertion loss at the low frequency side of the pass band so that the flatness of the pass band becomes even worse.

Note that according to the SAW filter of Japanese Examined Patent Publication No. 56-19765, insertion loss at the center of the pass band is less than at the shoulders of the pass band so that the flatness of the pass band needs significant improvement. When a LiTaO$_3$ substrate is used as the piezoelectric substrate, the flatness of the pass band is even worse because of the ripples that are generated by the SAW resonators.

SUMMARY OF THE INVENTION

To overcome the problems described above, preferred embodiments of the present invention provide a SAW filter that greatly improves the flatness of the filter characteristics within the pass band.

According to a preferred embodiment of the present invention, a SAW filter includes a plurality of interdigital transducers arranged on a piezoelectric substrate so as to define a plurality of one-port SAW resonators, the plurality of one-port SAW resonators being connected so as to constitute a ladder circuit having a series arm and at least two parallel arms. Each of the plurality of the one-port SAW resonator includes first and second comb-shaped electrodes. The first and second comb-shaped electrodes, each of which has a plurality of electrode fingers and a bus bar connected to first ends of the plurality of electrode fingers, are interdigitated with each other so that second ends of the plurality of electrode fingers of each of the first and second comb-shaped electrodes extend towards the bus bar of the other of the first and second comb-shaped electrodes to define an interdigital terminal. A gap between the bus bar of the first comb-shaped electrode and the second ends of the electrode fingers connected to the bus bar of the second comb-shaped electrode of the one-port SAW resonator connected at one of the at least two parallel arms differs from the corresponding gap in the other one-port SAW resonators connected at the other of the at least two parallel arms.

As a result of this unique structure, in the plurality of one-port SAW resonators defining the parallel-arm resonators, the frequency of the ripples occurring between the resonant frequency and the anti-resonant frequency is evenly distributed. Accordingly, the frequency of the ripples is distributed in the pass band of the SAW filter itself, thus, the flatness of the pass band is greatly improved.

In another preferred embodiment, the gap in the IDT of the one-port SAW resonator connected at one of the at least two parallel arms is preferably about 0.5 λ or more, where λ is the wavelength of a surface acoustic wave excited on the piezoelectric substrate. In this case, the loss on the shoulder of the low-frequency side of the pass band of the SAW filter is unlikely to occur so that the steepness of the filter characteristics on the low-frequency side of the pass band is increased. Further, when the gap is preferably set within the range of about 1.0 λ to about 5.0 λ, the frequency of the ripple in the one-port SAW resonator is even higher so that the ripple frequency is set at around the center of the pass band.

Therefore, in the SAW filter of preferred embodiments, the insertion loss is about the same at the center and at both shoulders of the pass band. Thus, the flatness of the filter characteristics in the pass band is greatly improved. In addition, when a $LiTaO_3$ substrate is used as the piezoelectric substrate, the ripple appears between the resonant frequency and the anti-resonant frequency. Accordingly, in preferred embodiments of the present invention, it is preferable to use a $LiTaO_3$ substrate as the substrate because the present invention makes positive use of the ripple to improve the flatness of the filter characteristics in the pass band.

Other features, elements and advantages of the present invention will be described in detail below with reference to preferred embodiments of the present invention and the attached drawings.

BRIEF DESCRIPTION OF THE DRAWINGS

The present invention will become more fully understood from the detailed description given herein below and the accompanying drawings which are given by way of illustration only, and thus do not limit the present invention and wherein.

DETAILED DESCRIPTION OF PREFERRED EMBODIMENTS

Figure 1A:
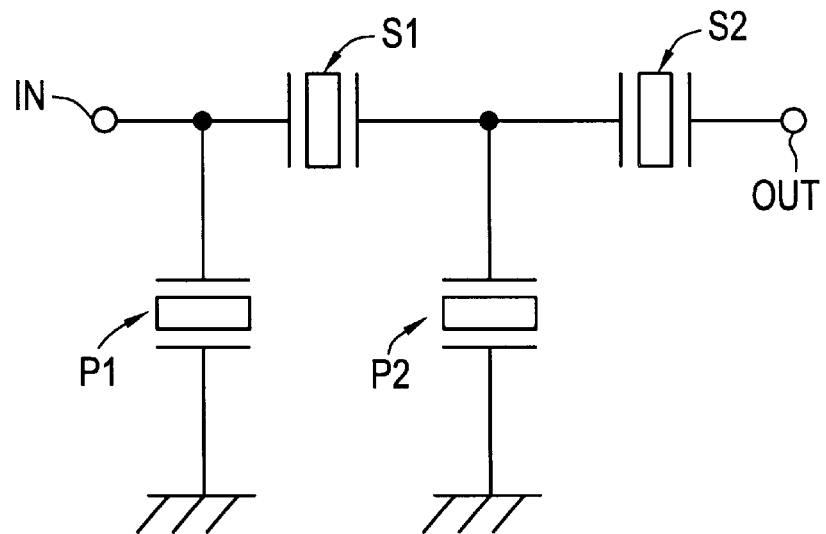
FIG. 1A shows a circuit diagram of a SAW filter according to a preferred embodiment of the present invention.
Figure 1B:
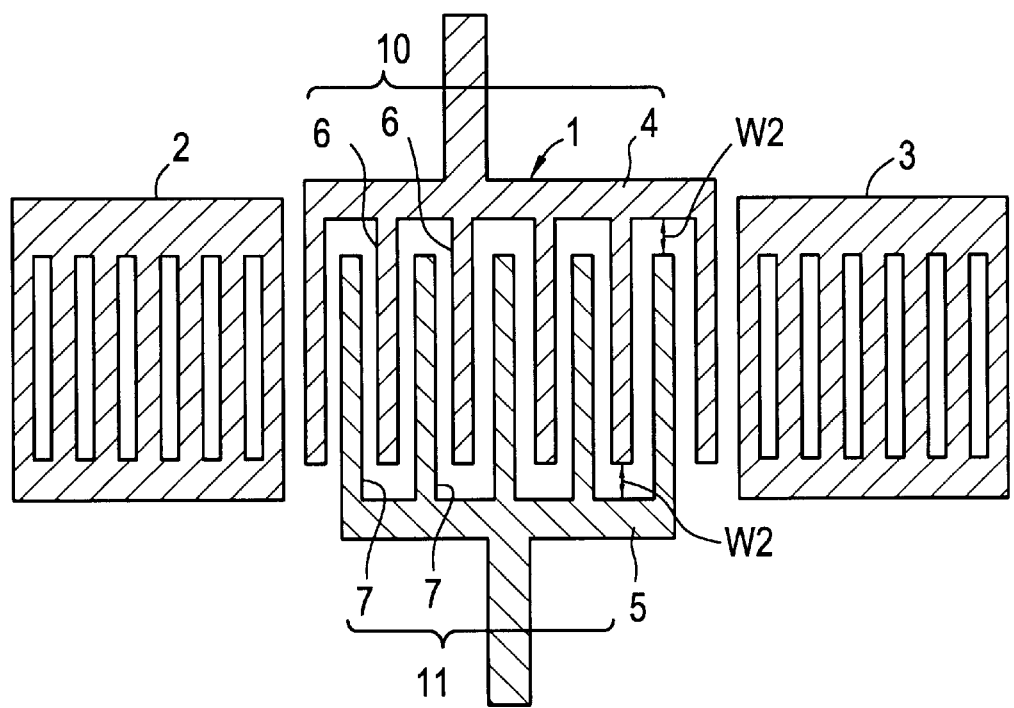
FIG. 1B is a plan view illustrating the electrode structure of a one-port SAW resonator used in the SAW filter of the preferred embodiment shown in FIG. 1A.

FIG. 1A shows a circuit structure of a SAW filter according to a preferred embodiment of the present invention. FIG. 1B is a plan view showing the electrode structure of a one-port SAW resonator included in the present preferred embodiment.

Referring to FIG. 1A, the SAW filter of the preferred embodiment has a ladder circuit structure. That is, a series arm is preferably located between an input end IN and an output end OUT, and a plurality of parallel arms are preferably located between the series arm and reference potentials.

One-port SAW resonators S1 and S2 are series-arm resonators which are connected to the series arm. Each of the one-port SAW resonators P1 and P2 are parallel-arm resonators which are connected to each of the parallel arms. In addition, as shown in FIG. 1A, from the input end IN towards the output end OUT, the parallel-arm resonators and the series-arm resonators are alternately arranged. However, the number of series-arm resonators and parallel-arm resonators in the present invention should not be restricted to that of the preferred embodiment shown in FIGS. 1A and 1B, and any number or combination of series-arm resonators and parallel-arm resonators may be used. For example, it possible to use a structure that has only one series-arm resonator, or three or more series-arm resonators. Similarly, the number of parallel-arm resonators should not be restricted as long as there are at least two parallel arms in the structure.

Referring to FIG. 1B, a description of the electrode structure of the one-port SAW resonators S1, S2, P1, and P2 will be provided. In the one-port SAW resonator, reflectors 2 and 3 are preferably positioned on each side of the IDT 1, respectively, preferably in a direction in which a surface acoustic wave propagates in the IDT 1.

The IDT 1 preferably includes a pair of comb-shaped electrodes 10 and 11. The comb-shaped electrode 10 includes a plurality of electrode fingers 6 and a bus bar 4 connected to first ends of the electrode fingers 6. The comb-shaped electrode 11 includes a plurality of electrode fingers 7 and a bus bar 5 connected to first ends of the electrode fingers 7. The comb-shaped electrodes 10 and 11 preferably interdigitate with each other so that second ends of electrode fingers 6 or 7 of the comb-shaped electrode 10 or 11 extend toward the bus bar 5 or 4 of the comb-shaped electrode 11 or 10, respectively.

In addition, the reflectors 2 and 3 are preferably made of grating reflectors, in which both ends of a plurality of electrode fingers provided in the reflectors 2 and 3 are preferably short-circuited.

In the one-port SAW resonator, when an AC voltage is applied between the electrode fingers 6 and 7, the IDT 1 becomes excited and a surface acoustic wave is generated. The surface acoustic wave is confined between the reflectors 2 and 3, so that the resonance characteristics based on the surface acoustic wave can be extracted.

According to the present preferred embodiment of the present invention, in an IDT 1 of the one-port SAW resonators, which constitutes the SAW filter defining the ladder circuit, the gap W2 between the bus bar 4 or 5 of the comb-shaped electrode 10 or 11 and the second ends of the electrode fingers 7 or 6 connected to the bus bar 5 or 4 of the comb-shaped electrode 11 or 10 of one parallel one-port SAW resonator preferably differs from the corresponding gap W2 in the other one-port SAW resonator connected to the other parallel arm. The difference in gap widths W2 allows the flatness of the filter characteristics in the pass band to be greatly improved. How this occurs will be explained below.

Figure 18:
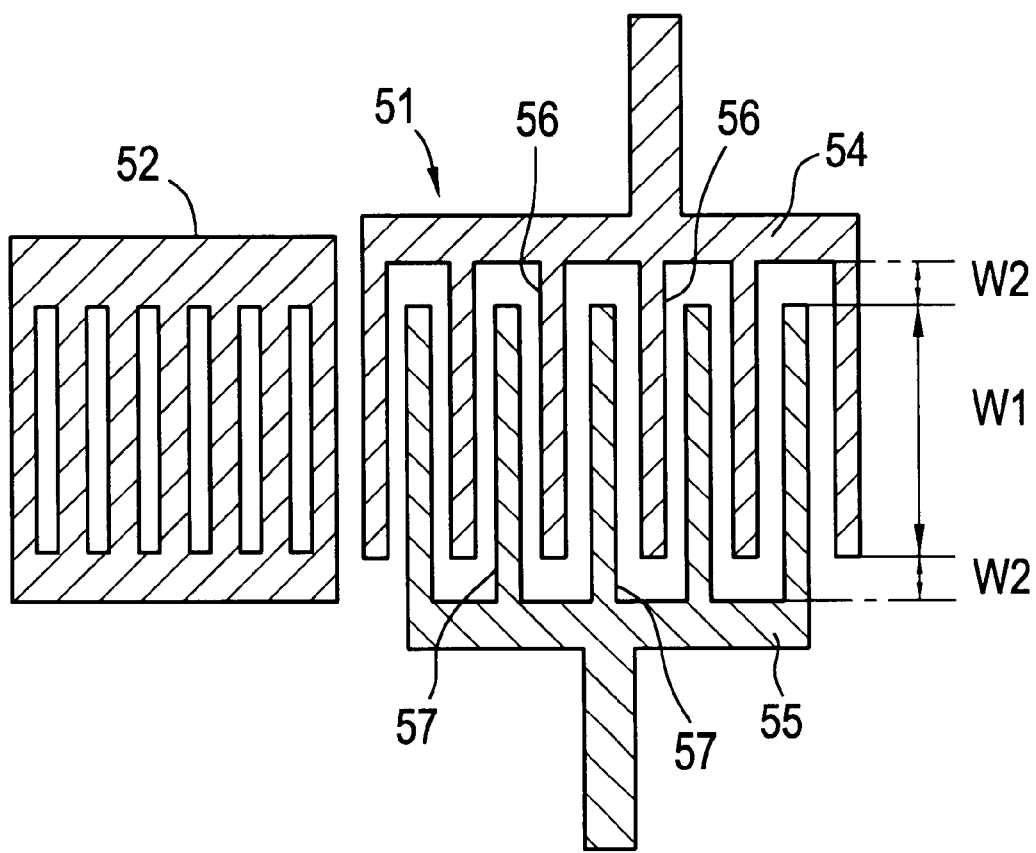
FIG. 18 is a plan view for illustrating the relationship between the gap width and the interdigitating width of the electrode fingers in the conventional one-port SAW resonator.

In the above-mentioned Japanese Unexamined Patent Publication No. 6-232682, there is disclosed a method for reducing a ripple existing between a resonant frequency and an anti-resonant frequency in the one-port SAW resonator using a piezoelectric substrate made of $LiTaO_3$. FIG. 18 shows the electrode structure of the one-port SAW resonator described in the conventional art. It should be pointed out that, in FIG. 18, a reflector 52 disposed on one side of an IDT 51 is shown, but a reflector disposed on the other side of IDT 51 is not shown.

In the conventional art, it is known that the influence of a ripple existing between a resonant frequency and an anti-resonant frequency can be decreased when the ratio W1/W2 is increased. In other words, the conventional method is to make the gap width W2 smaller than the interdigitating width W1 because this will reduce the occurrence of a surface skimming bulk wave (SSBW) so that the influence of the above-mentioned ripple is greatly decreased.

As described in the above conventional art, the occurrence of SSBW is considered to be undesirable because it deteriorates the characteristics of a SAW resonator, so it is therefore desirable in the conventional art to make the gap width W2 as small as possible.

In contrast, preferred embodiments of the present invention use the ripple as much as possible so that significant improvements in the filter characteristics are achieved. In other words, preferred embodiments of the present invention use the ripple in a positive manner in contrast to conventional wisdom and devices which attempt to suppress the ripple from occurring. The present invention makes use of the ripple generated by a SAW resonator by generating a plurality of ripples with the use of a plurality of SAW resonators to distribute the ripples in the pass band of a SAW filter. In this way, preferred embodiments of the present invention greatly improve the flatness of the pass band in the SAW filter.

The preferred embodiments of the present invention provides empirical evidence that, in the one-port SAW resonator, making the interdigitating width W1 fixed and changing only the gap width W2 allows the frequency of the ripple to be easily controlled.

Figure 2:
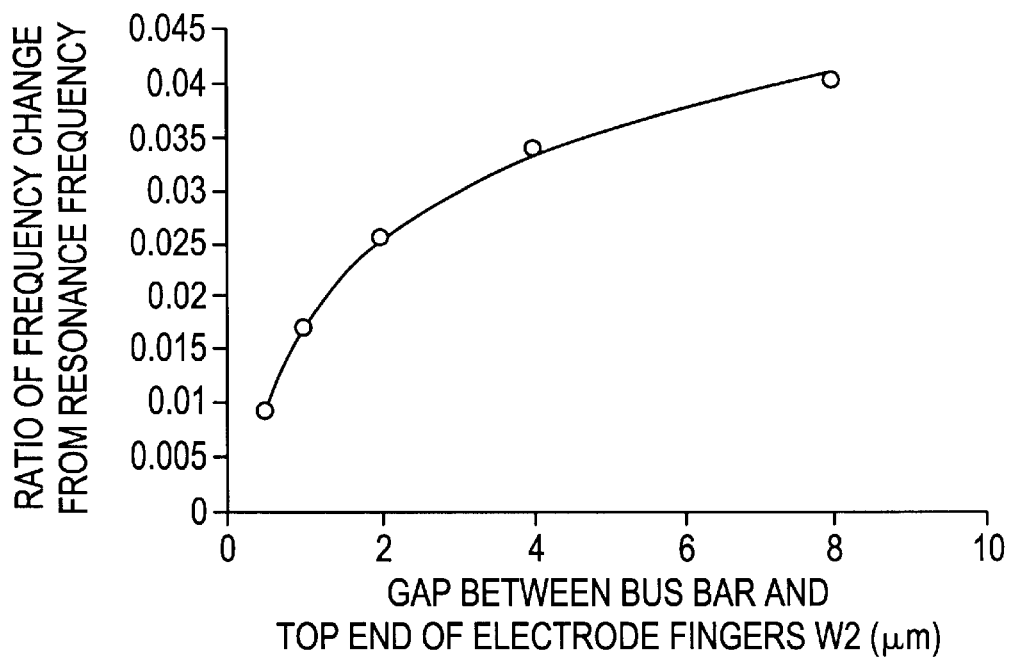
FIG. 2 is a graph showing the relationship between the gap width W2 between a bus bar and one end of the electrode fingers in a one-port SAW resonator, and the frequency of a ripple between a resonant frequency and an anti-resonant frequency in a preferred embodiment of the present invention.

Referring to FIG. 2, the graph shows the relationship between the gap width W2 in the one-port SAW resonator and the frequency of the ripple occurring between the resonant frequency and the anti-resonant frequency. The frequencies f/f0 indicated by the vertical axis are standardized values, where f indicates the difference between the frequency at which a ripple occurs and the resonant frequency f0 of the SAW resonator. As shown in FIG. 2, changing the gap width W2 changes the frequency at which the ripple occurs So, in the SAW filter having a ladder circuit structure, desired excellent filter characteristics are achieved by combining the resonance characteristics of a plurality of one-port SAW resonators. Accordingly, by making the gap width W2 different among the resonators in the SAW filter allows the frequencies at which the ripples occur to be distributed within the pass band. For example, if the gap width W2 in a one-port SAW resonator connected to one parallel arm differs from the corresponding gap width in the one-port SAW resonator connected to the other parallel arm, the frequency of the above-mentioned ripple occurring in the pass band of the SAW filter is distributed, so that the flatness of the pass band is greatly improved.

In addition, when the gap width W2 is about 0.5 λ or more, the frequency of the ripple is higher so that the loss on the shoulder of the low-frequency side of the pass band is suppressed, which increases the steepness on the low-frequency side of the pass band.

Further, when the gap width W2 is about 1.0 λ or more, the frequency of the ripple is even higher so that the ripple appears around the center of the pass band. However, in the conventional SAW filter having the ladder circuit, insertion loss at the center of the pass band is less than at the shoulders of the pass band. Therefore, by moving the ripple to around the center of the pass band, the insertion loss at around the center of the pass band is increased so that preferred embodiments of the present invention greatly improve the flatness of the filter characteristics in the pass band.

Note that if the gap width W2 of the one-port SAW resonator that is connected to a parallel arm is excessive, insertion loss at frequencies spaced away from the ripple frequency is sometimes deteriorated. Thus, in order to prevent increasing the insertion loss, it is preferable to set the gap width W2 to be about 5.0 λ or less. Thus, preferably, the gap width W2 is set within the range of about 0.5 λ to about 5.0 λ, and more preferably, in the range of about 1.0 λ to about 5.0λ.

Next, a description of the detailed experimental examples of the SAW filter of preferred embodiments of the present invention will be provided.

1. First Experimental Example

A LiTaO$_3$ substrate, which is of 36°Y-cut X-propagation, is used as a piezoelectric substrate. Individual one-port SAW resonators and electrodes connected thereto are provided on the substrate. Al is used to define the one-port SAW resonators and for connecting the electrodes.

The one-port SAW resonators S1 and S2 defining series-arm resonators and the one-port SAW resonators P1 and P2 defining parallel-arm resonators are respectively formed as follows.

(1) The one-port SAW resonator P1 (a parallel-arm resonator)

The number of pairs of electrode fingers equals 40, the interdigitating width of the electrode fingers is about 80 μm (20 λ), the gap width W2 in the IDT is about 0.25 λ, and the number of electrode fingers in a reflector equals 100.

(2) The one-port SAW resonator P2 (a parallel-arm resonator)

The number of pairs of the electrode fingers equals 40, the interdigitating width of the electrode fingers is about 160 μm (40 λ), the gap width W2 is about 1.5 λ, and the number of the electrode fingers in a reflector equals 100.

(3) The one-port SAW resonator S1 (a series-arm resonator)

The number of pairs of the electrode fingers is 80, the interdigitating width of the electrode fingers is about 40 μm (10.5 λ), and the number of the electrode fingers in a reflector is 100.

(4) The one-port SAW resonator S2 (a series-arm resonator)

The number of pairs of the electrode fingers is 80, the interdigitating width of the electrode fingers is about 80 μm (21 λ), and the number of the electrode fingers in a reflector is 100.

Figure 3:
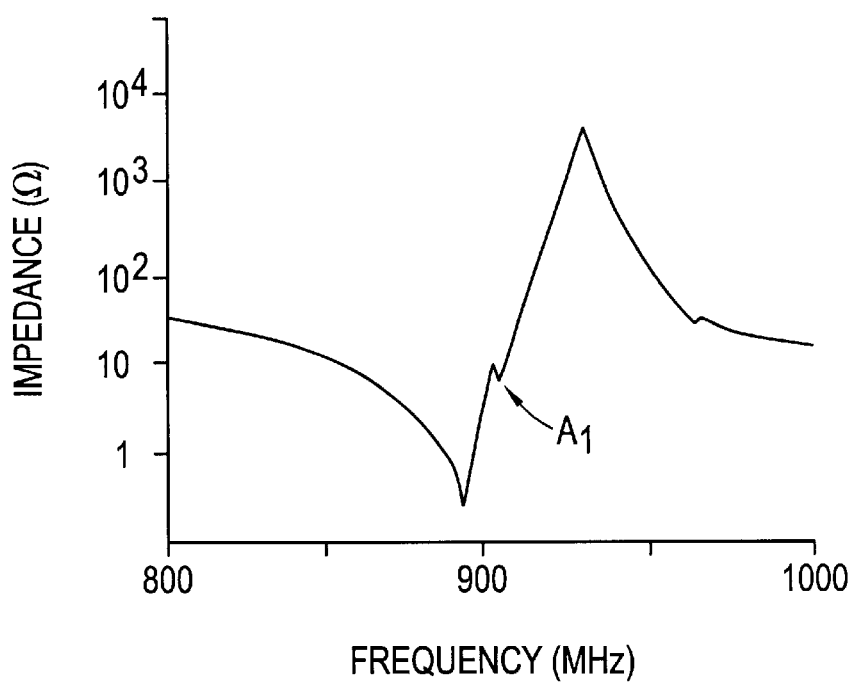
FIG. 3 is a graph showing the impedance-frequency characteristics of a one-port SAW resonator P1 in the preferred embodiment shown in FIG. 1A.
Figure 4:
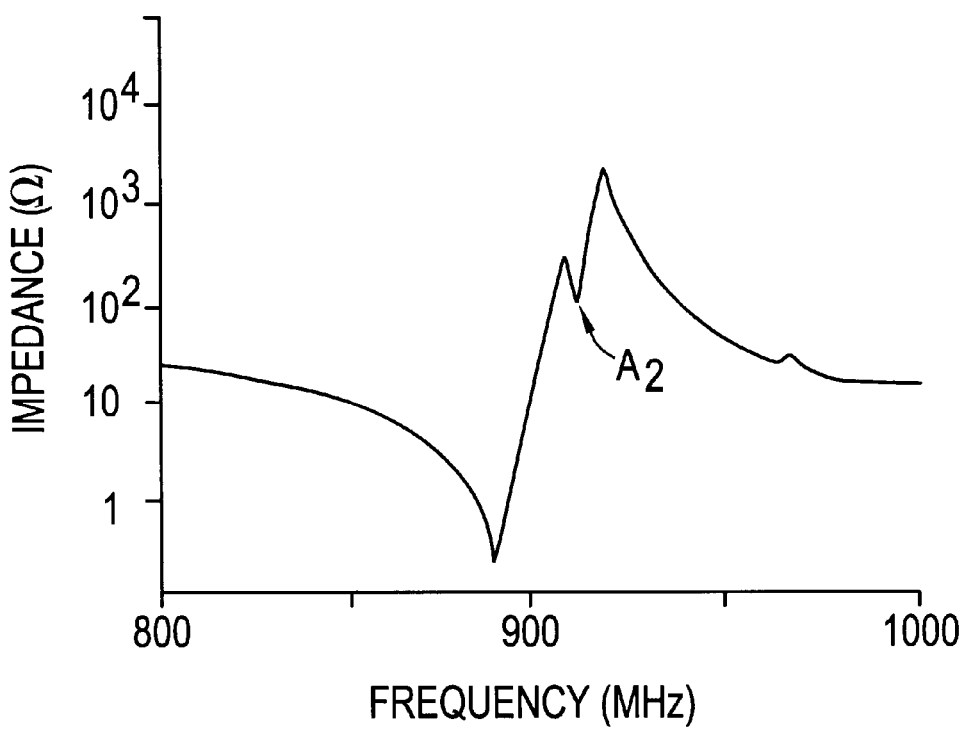
FIG. 4 is a graph showing the impedance-frequency characteristics of a one-port SAW resonator P2 in the preferred embodiment shown in FIG. 1A.

Referring to FIG. 3, the graph shows the impedance-frequency characteristics of the one-port SAW resonator P1, which is formed as described above. Similarly, FIG. 4 is a graph that shows the impedance-frequency characteristics of the one-port SAW resonator P2, which is formed as described above. Note that the frequency of the ripple A$_1$ (FIG. 3) of the one-port SAW resonator P1 differs from the frequency of the ripple A$_2$ (FIG. 4) of the one-port SAW resonator P2. Thus, the occurrence of the ripple in the SAW resonators can be manipulated so that it is advantageously distributed throughout the pass band of the SAW filter. In this way, preferred embodiments of the present invention greatly improve the flatness in the pass band of the SAW filter.

Figure 5:
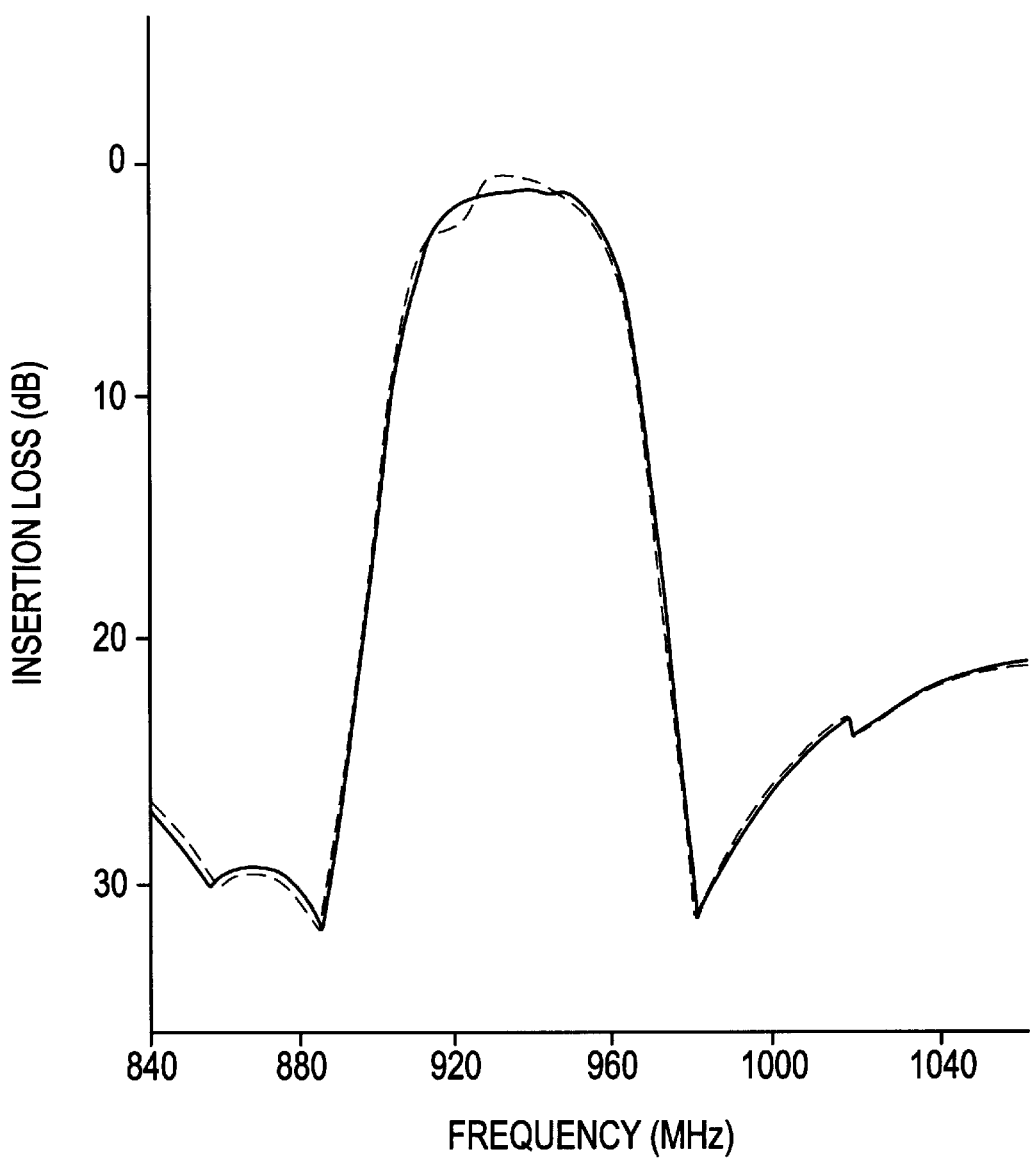
FIG. 5 is a graph showing the attenuation-frequency characteristics of the SAW filter of the first experimental example of preferred embodiments of the present invention and that of a SAW filter prepared for comparison to preferred embodiments of the present invention.

Referring to FIG. 5, the solid line in the graph shows the attenuation-frequency characteristics of the SAW filter of the first experimental example. For comparison, the broken line shows the filter characteristics of a SAW filter formed in the same way as the above-described first experimental example, except that the gap widths W2 in the one-port SAW resonators P1 and P2 are both set at about 1.0 λ.

From FIG. 5, it is clear that when the gap widths W2 in the one-port SAW resonators P1 and P2 are different, and further, if the gap width W2 of the one-port SAW resonator P2 is set at least at about 1.0 λ, the flatness within the pass band is greatly improved, and also the steepness of the filter characteristics at the low frequency shoulder of the pass band is greatly improved. Note that even when a LiTaO$_3$ substrate has a cutting angle other than a 36°Y-cut, the same advantages can be obtained.

2. Second Experimental Example

Figure 6:
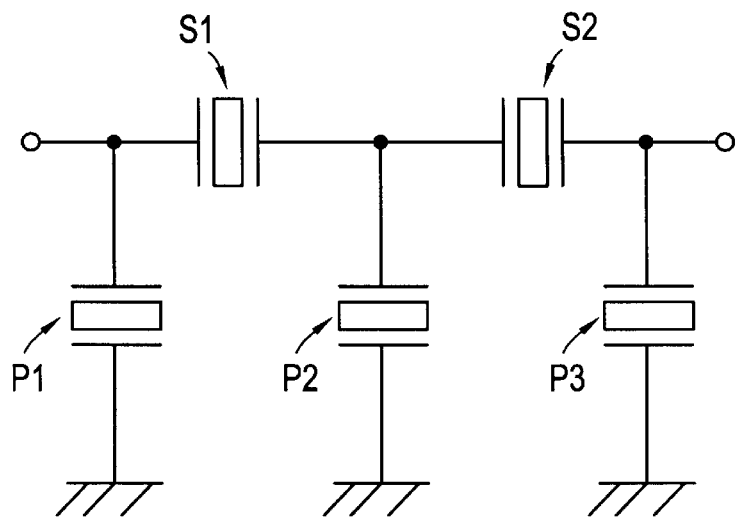
FIG. 6 shows a circuit diagram of a SAW filter according to a second experimental example of preferred embodiments of the present invention.

Referring to FIG. 6, there is provided a SAW filter having a ladder circuit where the one-port SAW resonators S1 and S2 define series-arm resonators, and the one-port SAW resonators P1 to P3 define parallel-arm resonators. Note that the SAW filter in the second experimental example is produced in the same way as in the first experimental example, each using a 36°Y-cut X-propagation LiTaO$_3$ substrate. However, the structure of the SAW resonators in the second experimental example is as follows.

(1) The one-port SAW resonator P1 (a parallel-arm resonator)

The number of pairs of the electrode fingers is 40, the interdigitating width of the electrode fingers is about 80 μm (20 λ), the gap width W2 is about 1.0 λ, and the number of the electrode fingers in a reflector is 100.

(2) The one-port SAW resonator P2 (a parallel-arm resonator)

The number of pairs of the electrode fingers equals 80, the interdigitating width of the electrode fingers is about 200 μm (50 λ), the gap width W2 is about 1.5 λ, and the number of the electrode fingers in a reflector is 100.

(3) The one-port SAW resonator P3 (a parallel-arm resonator)

The number of pairs of the electrode fingers is 40, the interdigitating width of the electrode fingers is about 80 μm (20 λ), the gap width W2 is about 2.0 λ, and the number of the electrode fingers in a reflector is 100.

(4) The one-port SAW resonators S1 and S2 (series-arm resonators)

The number of pairs of the electrode fingers is 80, the interdigitating width of the electrode fingers is about 40 μm (10.5 λ), and the number of the electrode fingers in a reflector is 100.

Figure 7:
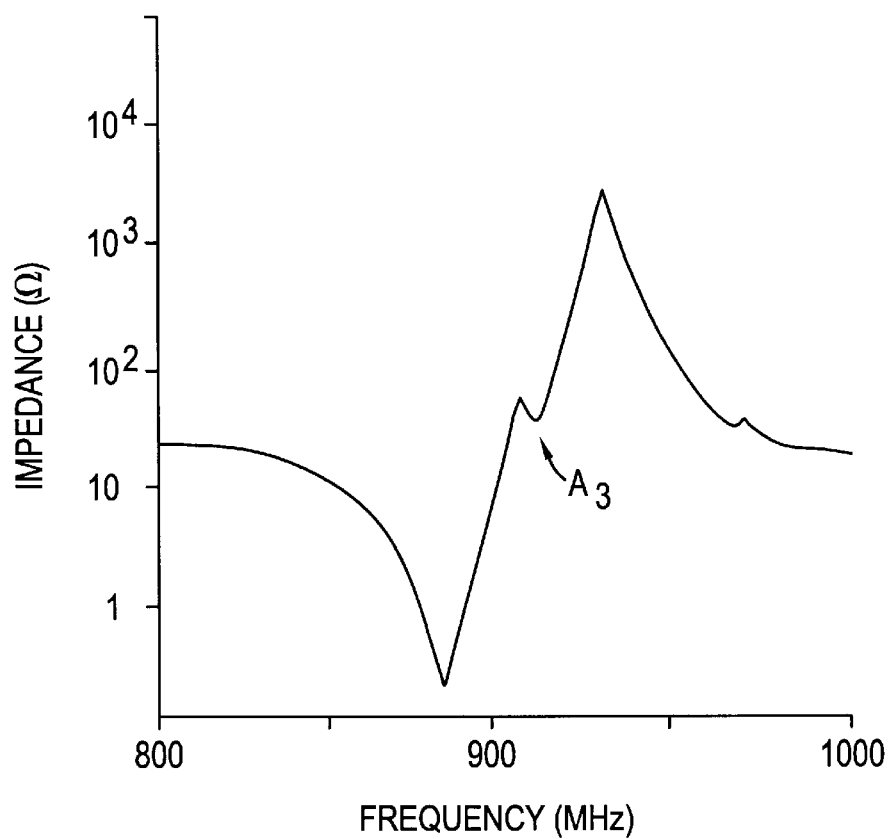
FIG. 7 is a graph showing the impedance-frequency characteristics of a one-port SAW resonator P1 of the second experimental example shown in FIG. 6.
Figure 8:
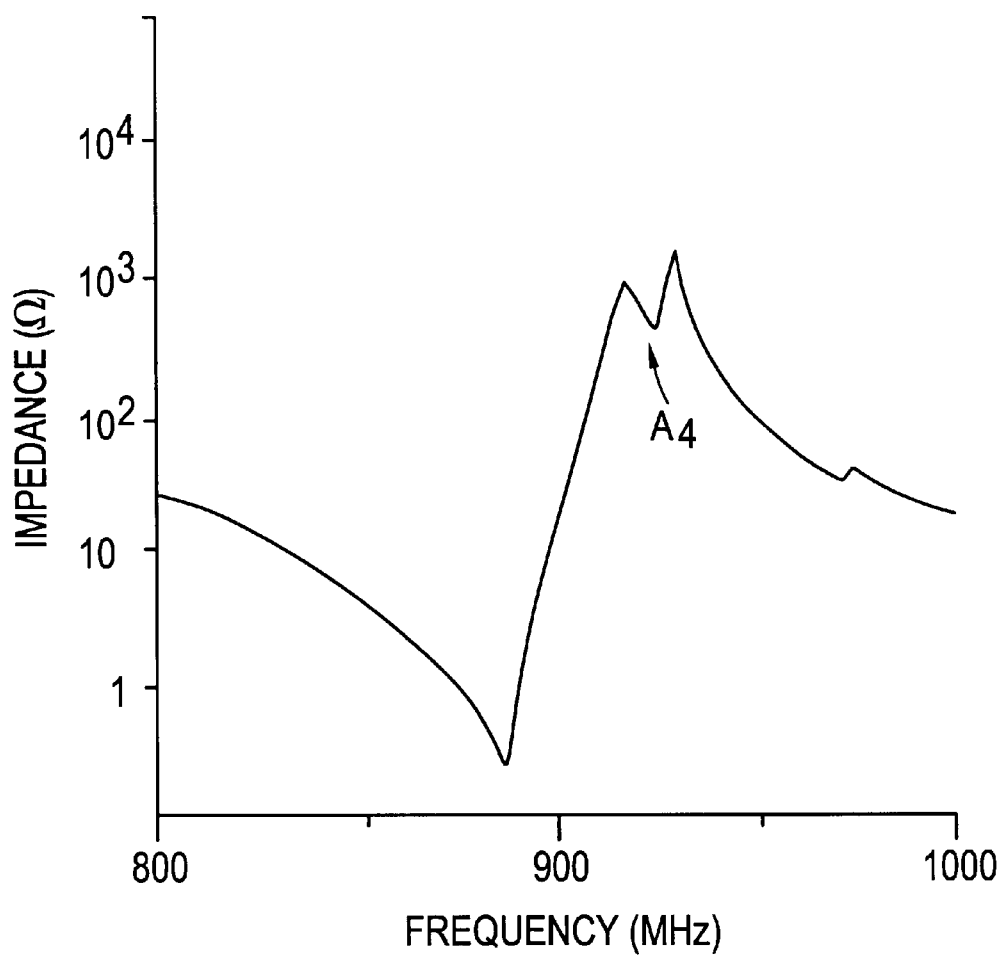
FIG. 8 is a graph showing the impedance-frequency characteristics of a one-port SAW resonator P2 of the second experimental example shown in FIG. 6.
Figure 9:
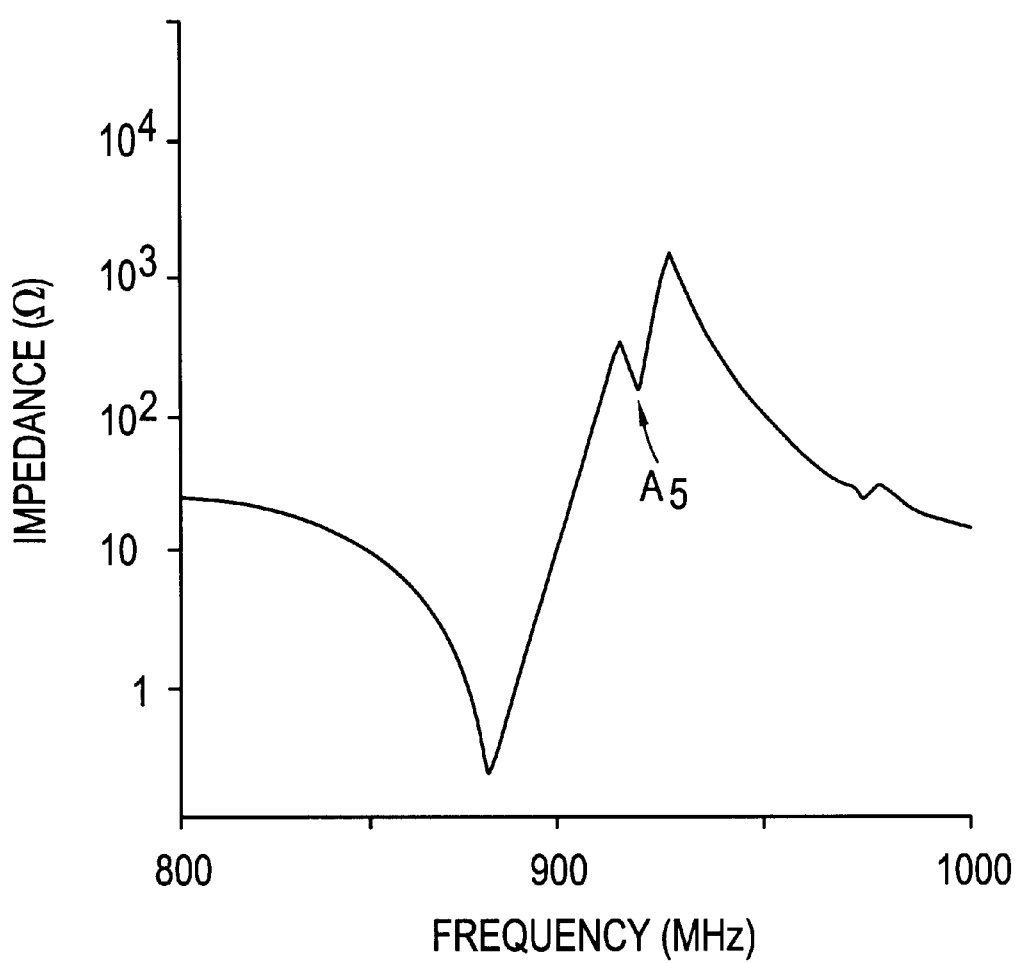
FIG. 9 is a graph showing the impedance-frequency characteristics of a one-port SAW resonator P3 of the second experimental example shown in FIG. 6.

Referring to FIGS. 7 to 9, the graphs show the impedance-frequency characteristics of the one-port SAW resonators P1 to P3, respectively, according to the second experimental example. As is clear from FIGS. 7 to 9, the frequencies of the ripples A$_3$ to A$_5$, which occur between the resonant frequency and the anti-resonant frequency of the one-port SAW resonators P1 to P3, are all different. Thus, the positions at which the ripples occur are distributed throughout the pass band of the SAW filter.

Figure 10:
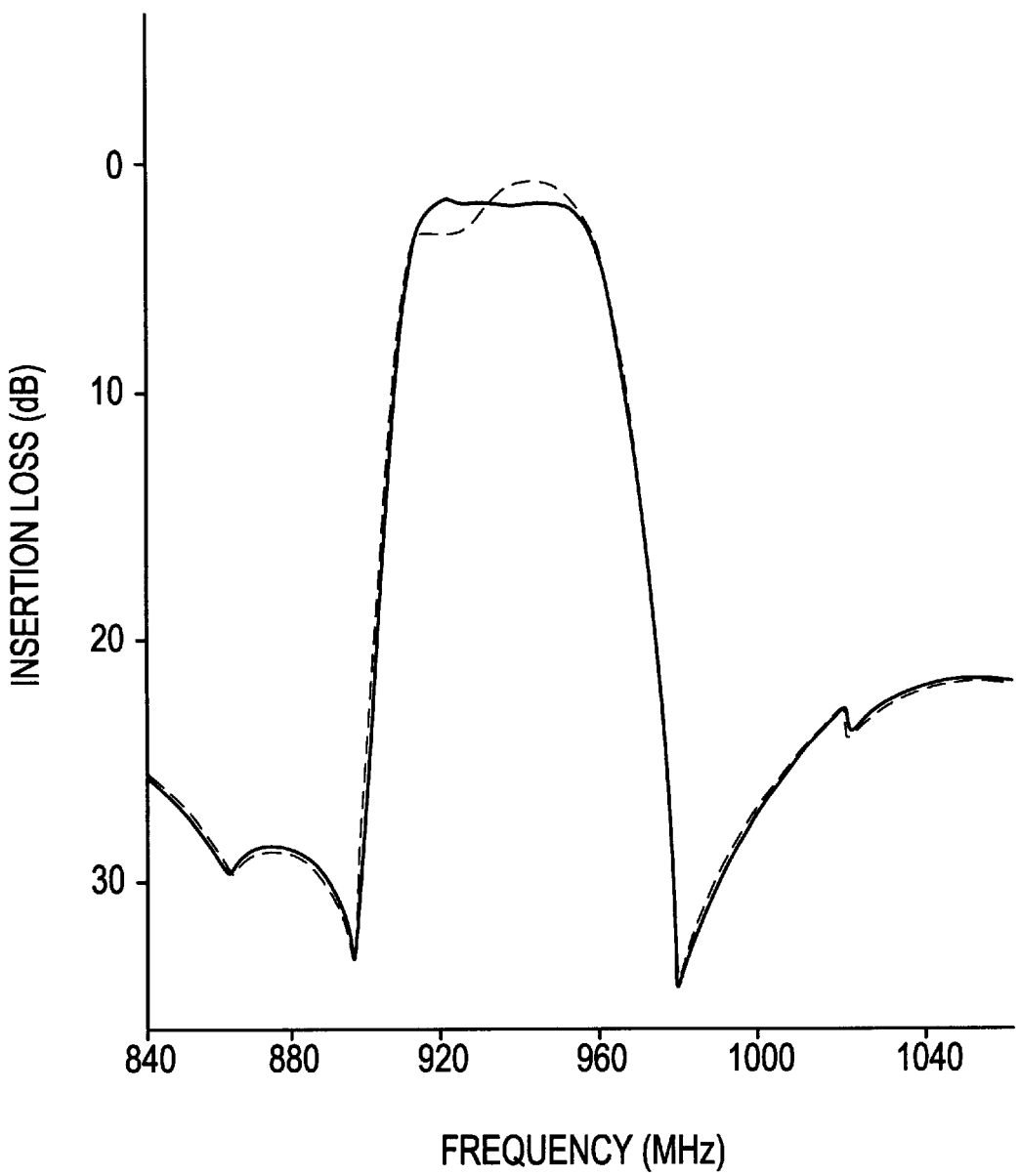
FIG. 10 is a graph showing the attenuation-frequency characteristics of the SAW filter of the second experimental example of preferred embodiments of the present invention and that of a SAW filter prepared for comparison to preferred embodiments of the present invention.

Referring to FIG. 10, the solid line indicates the impedance-frequency characteristics of the SAW filter according to the second experimental example. The broken line shows the impedance-frequency characteristics of the SAW filter prepared for comparison in the first experimental example. From FIG. 10, the filter characteristics of the SAW filter of the second experimental example has greatly improved flatness in the pass band region. There is improved flatness because the gap width W2 of the one-port SAW resonators P1 to P3 all differ from each other so that the ripples generated by the SAW resonators P1 to P3 are distributed in the pass band of the SAW filter. Further, in the second experimental example, the gap width W2 is greater than in the first experimental example, so that the flatness of the filter characteristics in the pass band is even more improved.

Note that even if a LiTaO$_3$ substrate with a cut other than a 36°Y-cut is used, the same benefits as in the experimental examples can be obtained. Additionally, in other preferred embodiments of the present invention, a substrate made of other piezoelectric materials can be used. More specifically, other preferred embodiments can use a piezoelectric substrate made from a piezoelectric single crystal substrate such as a LiNbO$_3$ substrate, or a piezoelectric substrate made of a piezoelectric ceramic material such as lead zirconate or lead titanate. Further, a piezoelectric substrate made by depositing a piezoelectric thin film on an insulated substrate may be used. However, it is preferred that a LiTaO$_3$ substrate be used as the piezoelectric substrate because it can better prevent deterioration of the flatness in the filter characteristics due to the ripples.

The present invention can be suitably applied to various electronic components or devices utilizing a surface acoustic wave filter. A duplexer and a communication apparatus having a duplexer constitute examples of applications in which the unique features of the present invention are successfully used.

Figure 11:
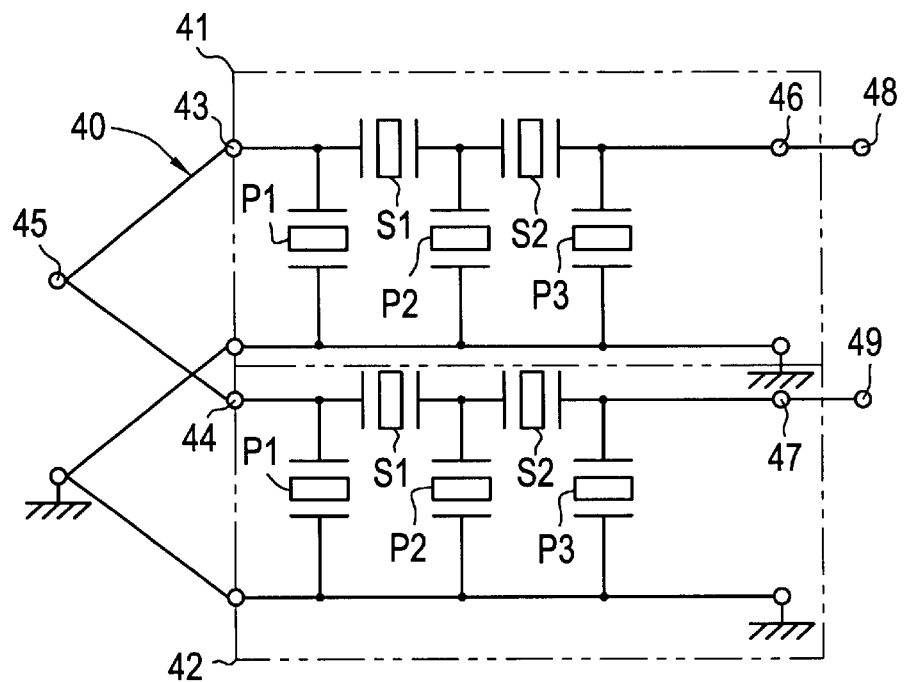
FIG. 11 is a circuit diagram showing a duplexer according to another preferred embodiment of the present invention.

As shown in FIG. 11, a duplexer 40 includes a first SAW filter 41 and a second SAW filter 42 having different center pass band frequencies. The SAW filters 41 and 42 shown in FIG. 11 are preferably the same as the SAW filter shown in FIG. 6, but other SAW filters according to various preferred embodiments of the present invention may be included. In the duplexer 40, an input terminal 43 of the SAW filter 41 and an input terminal 44 of the SAW filter 42 are electrically connected to a first input/output terminal 45 of the duplexer 40. The ground terminals of the SAW filters 41 and 42 are commonly connected so as to be grounded. The output terminal 46 of the SAW filter 41 and the output terminal 47 of the SAW filter 42 are respectively connected to a second input/output terminal 48 and third input/output terminal 49 of the duplexer 40.

The duplexer 40 has a excellent signal selectivity because the SAW filters 41 and 42 have excellent steepness at the high end of the pass band thereof. In addition, since other components such as capacitors are not required, the duplexer 40 has a greatly reduced size.

Figure 12:
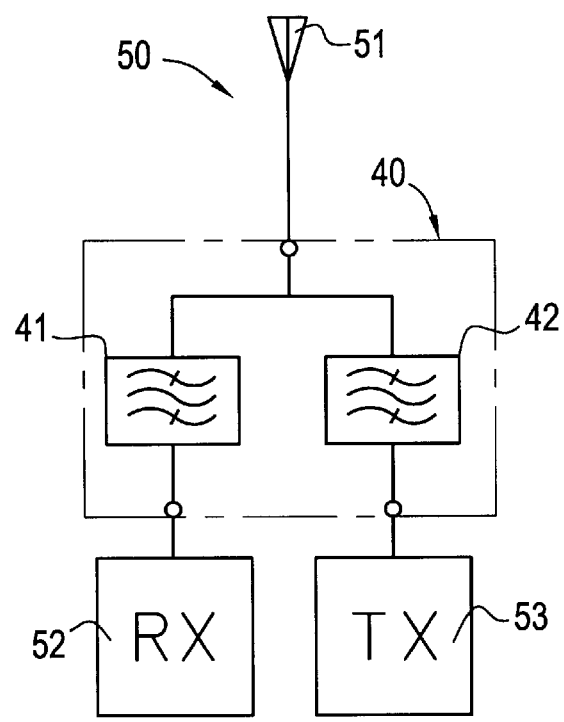
FIG. 12 is a block diagram showing a communication apparatus according to still another preferred embodiment of the present invention.
Figure 13:
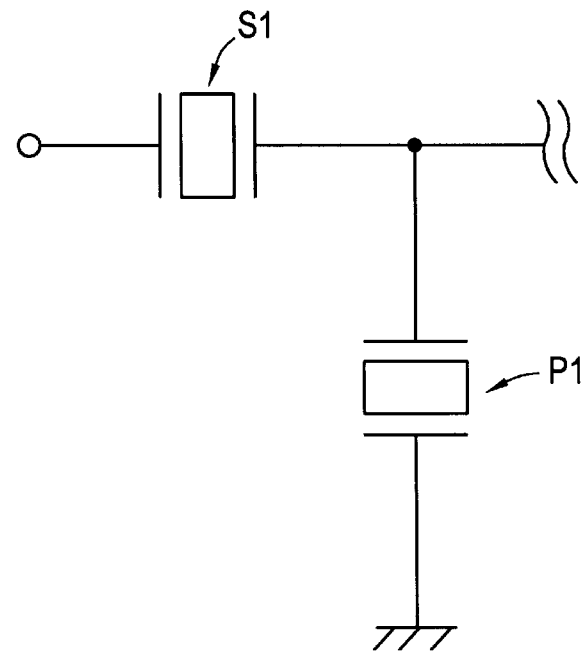
FIG. 13 is a circuit diagram of a conventional SAW filter having a ladder circuit structure.
Figure 14:
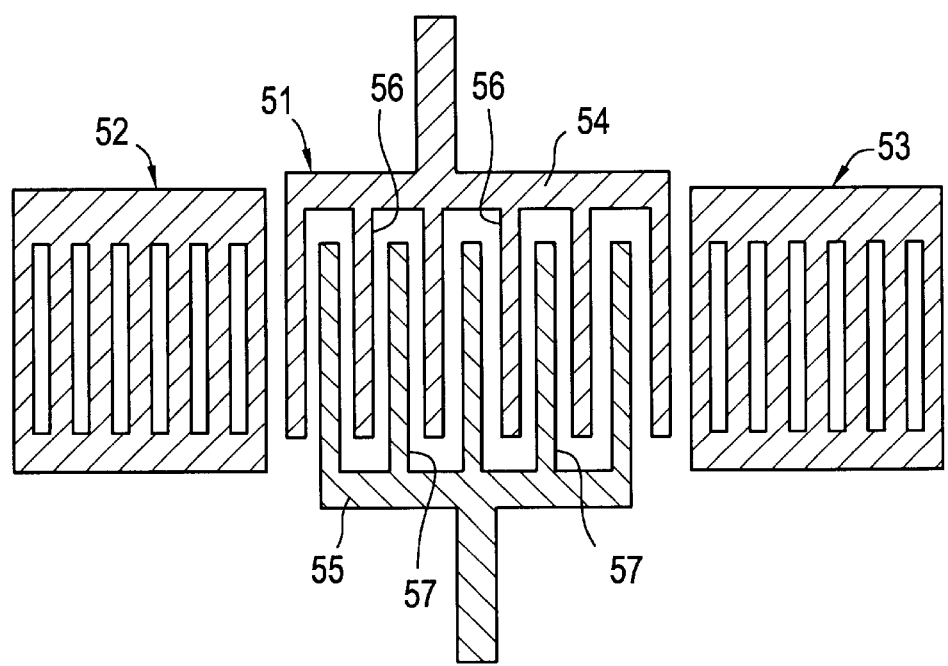
FIG. 14 is a plan view showing the electrode structure of a one-port SAW resonator used in the conventional SAW filter.
Figure 15:
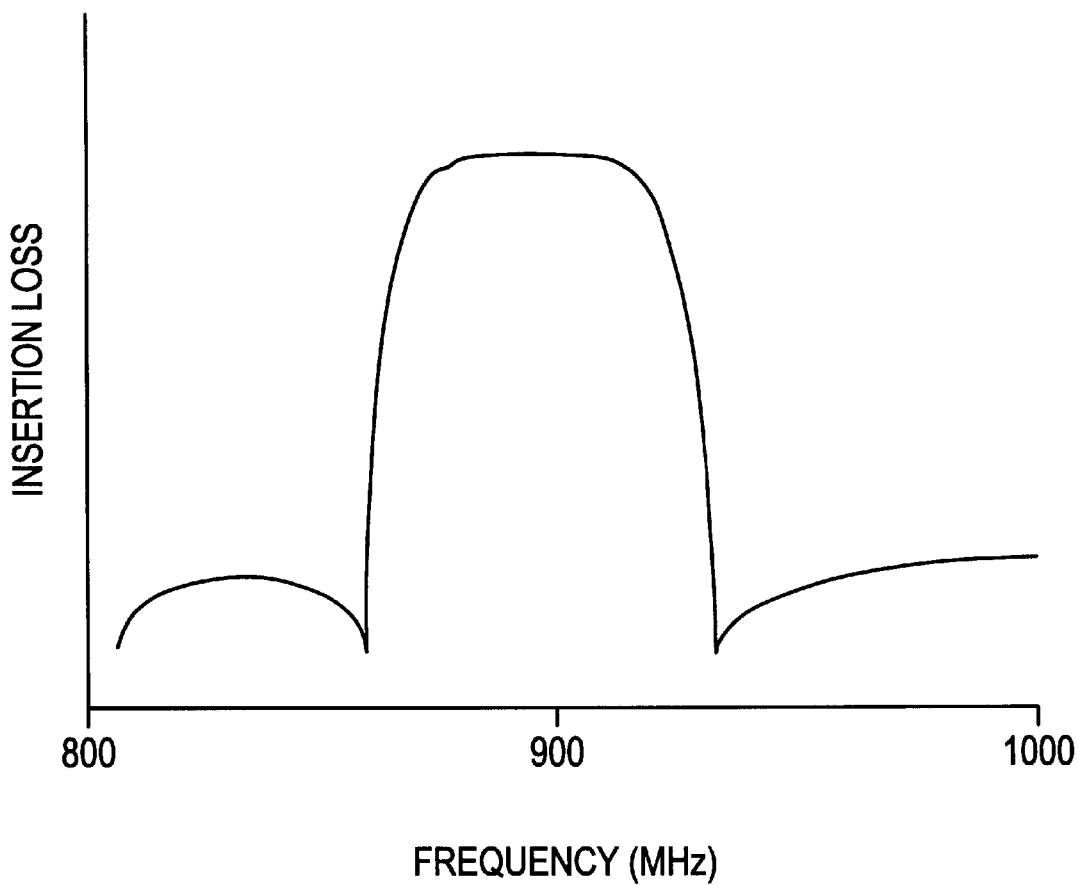
FIG. 15 is a graph showing the attenuation-frequency characteristics of the conventional SAW filter.
Figure 16:
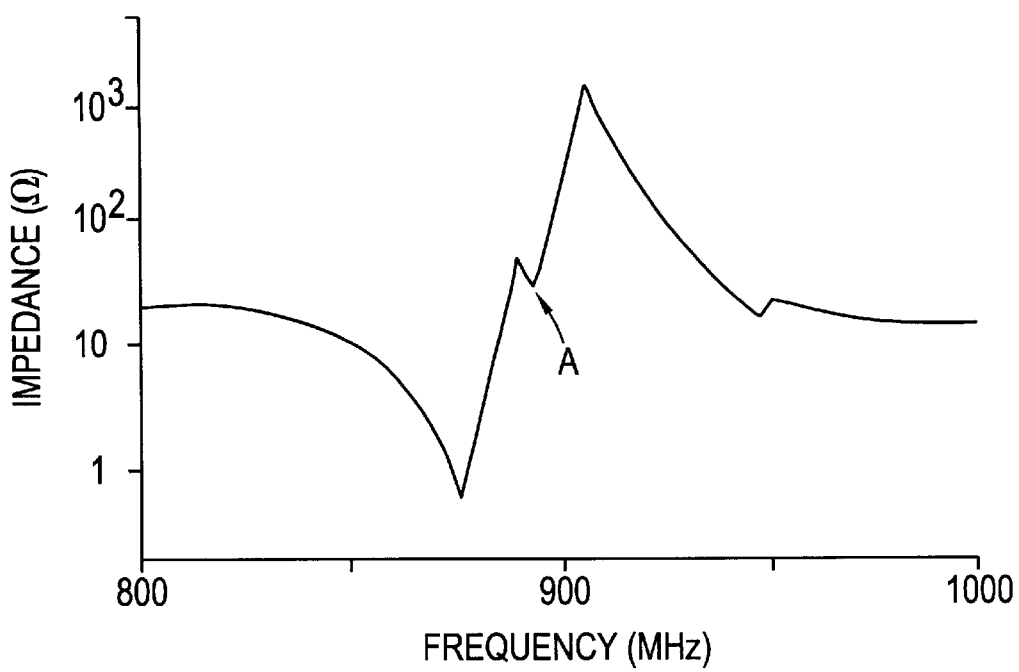
FIG. 16 is graph showing the impedance-frequency characteristics of the conventional one-port SAW resonator.
Figure 17:
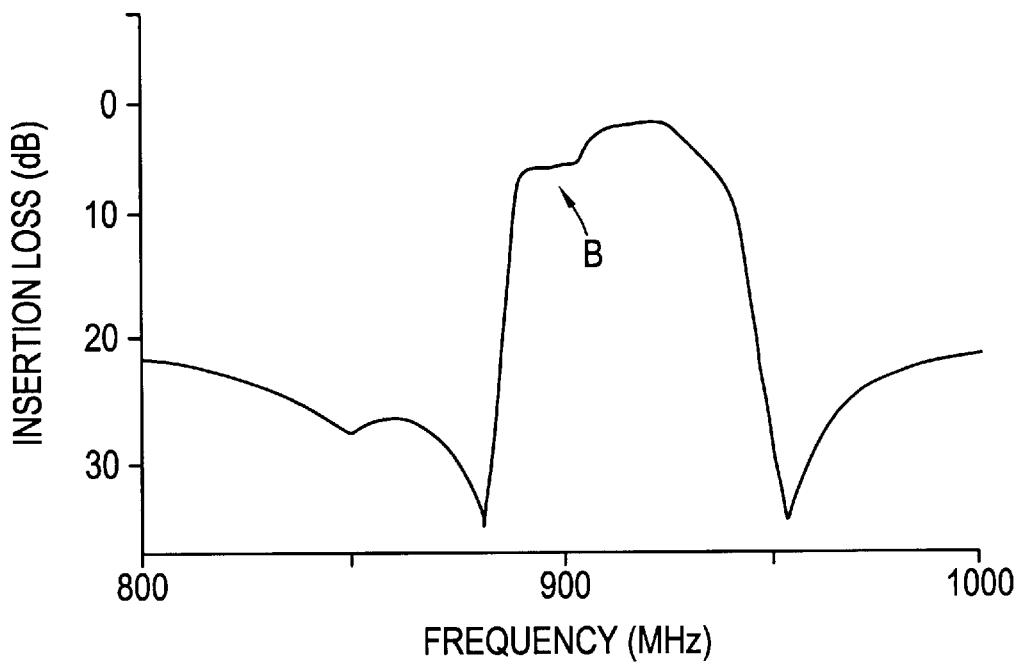
FIG. 17 is a graph showing the attentuation-frequency characteristics of the conventional SAW filter.

FIG. 12 is a block diagram of a communication apparatus 50 including the duplexer 40. The communication apparatus 50 may be a cellular phone, for example, as a cellular phone which usually requires a narrow communication band and a small-size body which is suitable to enjoy the aforementioned advantages of the duplexer 40. The communication apparatus 50 includes an antenna 51, a receiver 52 and a transmitter 53 connected to the first, second and third input/output terminals of the duplexer 40. The pass bands of the SAW filters 41 and 42 of the duplexer 40 are selected such that the signals received through the antenna 51 passes through the SAW filter 41 and are blocked by the SAW filter 42 and so that the signals to be transmitted from the transmitter 53 pass through the SAW filter 42.

While the invention has been particularly shown and described with reference to preferred embodiments thereof, it will be understood by those skilled in the art that the foregoing and other changes in form and details may be therein without departing from the spirit and scope of the invention.

What is claimed is:

1. A surface acoustic wave filter comprising:

a piezoelectric substrate;

a plurality of interdigital transducers arranged on the piezoelectric substrate so as to define a plurality of one-port SAW resonators, the plurality of one-port SAW resonators being connected so as to constitute a ladder circuit having a series arm and at least a first parallel arm and a second parallel arm, each of the plurality of interdigital transducers including first and second comb-shaped electrodes each of which has a plurality of electrode fingers and a bus bar connected to first ends of the plurality of electrode fingers, the first and second comb-shaped electrodes interdigitating with each other so that second ends of the plurality of electrode fingers of the first comb-shaped electrode extend toward the bus bar of the second comb-shaped electrode to define the respective interdigital transducer;

wherein the interdigital transducer of the one-port SAW resonator that is connected at the first parallel arm is arranged such that a gap between the bus bar of the first comb-shaped electrode and the second ends of the electrode fingers connected to the bus bar of the second comb-shaped electrode differs from a corresponding gap in the interdigital transducer of the one-port SAW resonator connected to the second parallel arm.

2. A surface acoustic wave filter according to claim 1, wherein the gap in the interdigital transducer connected to at least one of the parallel arms is about 0.5 λ or more, where λ is the wavelength of a surface acoustic wave excited on the piezoelectric substrate.

3. A surface acoustic wave filter according to claim 1, wherein the gap in the interdigital transducer of the one-port SAW resonator connected to at least one of the parallel arms is in the range of about 1.0 λ to about 5.0 λ, where λ is the wavelength of a surface acoustic wave excited on the piezoelectric substrate.

4. A surface acoustic wave filter according claim 1, wherein the gap in the interdigital transducer of each of the one-port SAW resonators connected at each of the parallel arms are all different, and wherein the gap of each of the one-port SAW resonators connected at each of the parallel arms is in the range of about 1.0 λ to about 5.0 λ, where λ is the wavelength of a surface acoustic wave excited on the piezoelectric substrate.

5. A surface acoustic wave filter according to claim 1, wherein the gap in the interdigital transducer of each of the one-port SAW resonators connected at each of the parallel arms are all different, and wherein the gap of each of the one-port SAW resonators connected at each of the parallel arms is greater than about 0.5 λ, where λ is the wavelength of a surface acoustic wave excited on the piezoelectric substrate.

6. A surface acoustic wave filter according claim 1, wherein the piezoelectric substrate is a LiTaO$_3$ substrate.

7. A surface acoustic wave filter according claim 1, wherein the piezoelectric substrate is a LiNbO$_3$ substrate.

8. A surface acoustic wave filter according claim 1, wherein the piezoelectric substrate is made of piezoelectric ceramic material.

9. A surface acoustic wave filter according claim 1, wherein the piezoelectric substrate includes a piezoelectric thin film on an insulating substrate.

10. A surface acoustic wave filter according claim 1, wherein at least one of the one-port SAW resonators further comprises first and second reflectors arranged on the piezoelectric substrate such that the first reflector is adjacent to the interdigital transducer on one side of the interdigital transducer and the second reflector is adjacent to the interdigital transducer on the other side of the interdigital transducer.

11. A surface acoustic wave filter according claim 1, wherein the ladder circuit has a plurality of series arms and parallel arms such that the series arms and the parallel arms are alternately positioned.

12. A duplexer comprising a pair of surface acoustic wave filters according to claim 1.

13. A communication apparatus comprising a duplexer according to claim 12.

14. A method of manufacturing a surface acoustic wave filter comprising the steps of:

providing a piezoelectric substrate;

forming a plurality of interdigital transducers arranged on the piezoelectric substrate so as to define a plurality of one-port SAW resonators, the plurality of one-port SAW resonators being connected so as to constitute a ladder circuit having a series arm and at least a first parallel arm and a second parallel arm, each of the plurality of interdigital transducers including first and second comb-shaped electrodes each of which has a plurality of electrode fingers and a bus bar connected to first ends of the plurality of electrode fingers, the first and second comb-shaped electrodes interdigitating with each other so that second ends of the plurality of electrode fingers of the first comb-shaped electrode extend toward the bus bar of the second comb-shaped electrode to define the respective interdigital transducer; and creating a gap in at least one of the plurality of interdigital transducers such that the gap exists between the bus bar of the first comb-shaped electrode and the second ends of the electrode fingers connected to the bus bar of the second comb-shaped electrode, and wherein the gap in the interdigital transducer of the SAW resonator that is connected to the first parallel arm is different from a corresponding gap of the interdigital transducer of the SAW resonator that is connected to the second parallel arm.

15. The method according to claim 14, wherein the gap in the interdigital transducer connected to at least one of the parallel arms is greater than about 0.5 $\lambda$, where $\lambda$ is the wavelength of a surface acoustic wave excited on the piezoelectric substrate.

16. The method according to claim 14, wherein the piezoelectric substrate is a $LiNbO_3$ substrate.

17. The method according to claim 14, wherein the piezoelectric substrate is a piezoelectric ceramic material.

18. The method according to claim 14, wherein each of the plurality of the SAW resonators connected to each of the parallel arms generates a ripple that is distributed in a pass band of the SAW filter.

19. The method according claim 14, wherein at least one of the one-port SAW resonators further comprises first and second reflectors arranged on the piezoelectric substrate such that the first reflector is adjacent to the interdigital transducer on one side of the interdigital transducer and the second reflector is adjacent to the interdigital transducer on the other side of the interdigital transducer.

20. The method according claim 14, wherein the ladder circuit has a plurality of series arms and parallel arms such that the series arms and the parallel arms are alternately positioned.

21. A method according to claim 14, wherein the piezoelectric substrate is a $LiTaO_3$ substrate.

22. The method according to claim 14, wherein the gap in the interdigital transducer that is connected to at least one of the parallel arms is in the range of about 1.0 $\lambda$ to about 5.0 $\lambda$, where $\lambda$ is the wavelength of a surface acoustic wave excited on the piezoelectric substrate.

* * * * *